United States Patent
Boas et al.

(10) Patent No.: US 7,495,987 B2
(45) Date of Patent: Feb. 24, 2009

(54) CURRENT-MODE MEMORY CELL

(75) Inventors: Andre Luis Vilas Boas, Campinas (BR);
Jefferson Daniel De Barros Soldera,
Campinas (BR); Fabio De Lacerda,
Campinas (BR); Alfredo Olmos,
Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 84 days.

(21) Appl. No.: 11/811,547

(22) Filed: Jun. 11, 2007

(65) Prior Publication Data

US 2008/0304348 A1 Dec. 11, 2008

(51) Int. Cl.
G11C 17/18 (2006.01)

(52) U.S. Cl. ............. 365/225.7; 365/96; 327/525; 327/53

(58) Field of Classification Search ......... 365/225.7, 365/96; 327/525, 53
See application file for complete search history.

(56) References Cited

U.S. PATENT DOCUMENTS

| | | | |
|---|---|---|---|
| 4,125,880 A * | 11/1978 | Taylor | 365/242 |
| 6,087,859 A * | 7/2000 | Lee et al. | 327/51 |
| 6,087,889 A | 7/2000 | Mok | |
| 6,175,261 B1 | 1/2001 | Sundararaman et al. | |
| 6,346,845 B1 | 2/2002 | Choi | |
| 6,384,664 B1 | 5/2002 | Hellums et al. | |
| 6,654,272 B2 * | 11/2003 | Santin et al. | 365/96 |
| 6,654,304 B1 | 11/2003 | Huang | |
| 6,670,843 B1 | 12/2003 | Moench et al. | |
| 6,903,986 B2 * | 6/2005 | Hejdeman et al. | 365/201 |
| 6,906,557 B1 | 6/2005 | Parker et al. | |
| 7,233,539 B2 * | 6/2007 | Boas et al. | 365/225.7 |
| 2003/0021148 A1 * | 1/2003 | Scheuerlein | 365/175 |
| 2006/0268644 A1 * | 11/2006 | Boas et al. | 365/225.7 |

* cited by examiner

*Primary Examiner*—VanThu Nguyen
*Assistant Examiner*—Eric Wendler
(74) *Attorney, Agent, or Firm*—Charles W. Bethards

(57) ABSTRACT

Methods and corresponding systems for reading a memory cell include a first current sourced from a first current source into a summing node, wherein the first current source is coupled to a first reference. A second current is sourced from a second current source into the summing node, wherein the second current source is coupled to the first reference through a programmable fuse. A third current is sunk from the summing node with a current sink, wherein the current sink is coupled to a second reference, and wherein a third current limit is greater than a first current limit and less than the sum of the first current limit and the second current limit. A voltage at the summing node is output in response to the first current, the second current, and the third current. The first and second current sources, and the current sink can be current mirrors.

20 Claims, 2 Drawing Sheets

CURRENT-MODE MEMORY CELL

BACKGROUND

1. Field

This disclosure relates generally to integrated circuits, and more specifically to one-time-programmable nonvolatile memory cells.

2. Related Art

Nonvolatile memory (NVM) is memory that can retain stored information, or data, even when not powered (i.e., when electrical power for the memory circuit has been removed). One type of nonvolatile memory is initially manufactured without stored data, and then later programmed by selectively programming a fuse element in memory cells. The fuse elements are programmed by allowing the fuse to remain intact to represent a first data state, or by "blowing" the fuse to create an open or high impedance circuit to represent a second data state. The programmable fuse can be programmed during manufacturing of the memory, or later, after manufacturing.

Thus, the fuse has two states: normal and blown. In one embodiment, the fuse can be a short piece of polysilicon that is used as a fuse element. To "program" the fuse element, a suitably large current can be passed through the fuse element, which then heats up and changes the resistance (i.e., impedance) of the fuse element.

One characteristic of a good nonvolatile memory that uses fusible elements is accuracy in reading the state of the fuse, which state represents the stored data. When the programming current is applied to the fuse, the resulting impedance of the fuse can fall within a range, as the fuse may or may not be blown completely. In spite of this range of impedances, accuracy in reading the state of the fuse remains paramount.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
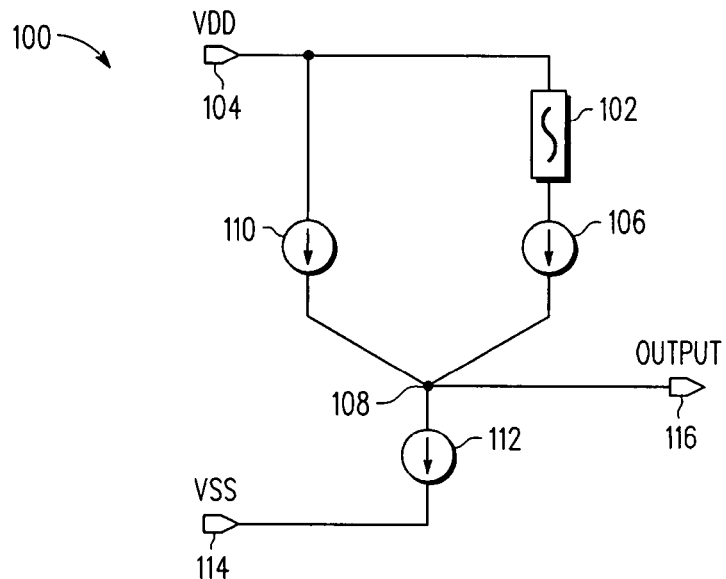
FIG. 1 is a high-level block diagram of a nonvolatile memory cell in accordance with one or more embodiments.

FIG. 1 is a high-level block diagram of portions of a nonvolatile memory cell in accordance with one or more embodiments. Nonvolatile memory cell 100 can be one of many such cells, which cells can be arranged in an addressable array for storing thousands or millions of bits of data in a programmable nonvolatile memory chip. Nonvolatile memory cell 100 may also be used one-at-a-time, or several-at-a-time, to store control bits, calibration data, or other parameters or configuration settings within an integrated circuit.

Nonvolatile memory cell 100 can include fuse 102, current sources 106 and 110, and current sink 112. Summing node 108 can receive current output by current sources 106 and 110, and can output current to current sink 112. Output terminal 116 can be coupled to summing node 108 to provide an output of the voltage of summing node 108.

Fuse 102 can be a polysilicon fuse that can be programmed after memory cell 100 is manufactured. To program fuse 102, fuse 102 can be left intact with a lower impedance to represent a first binary value, and it can be "blown" to represent a second binary value, wherein the fuse has a higher impedance because it has been heated, e.g., by the application of a suitably large current flowing through a programming circuit (not specifically shown in FIG. 1) or other means. When the fuse is blown, it is typically melted by the relatively high programming current, which can produce an open circuit, or a higher impedance.

Current sources, and current sinks, are electrical circuits or devices that deliver or absorb electric current at a predetermined rate (i.e., at a predetermined amperage). A practical current source (or sink) provides (or absorbs) a constant current, as long as the voltage drop across its terminals is higher than an appropriate limit. Otherwise the current provided (or absorbed) is no longer constant but proportional (not necessarily linear) to the voltage drop. According to Kirchhoff's Current Law (KCL), if two or more current sources and/or current sinks are connected to an electrical node (e.g., a summing node), the total current provided to that node equals the total current absorbed from that node.

In one embodiment, current sources 106, 110, and current sink 112 can be implemented with current mirror circuits. In operation, current sink 112 is designed with a current sinking magnitude (i.e., the limit of the current sunk by the current sink) that is greater than the current sourcing magnitude of (i.e., the current limit of) current source 106, and less than the sum of the current sourcing magnitudes of (i.e., the current limits of) current source 106 and current source 110. Therefore, if fuse 102 is not blown, its impedance is appropriately low so that the voltage drop across its terminals (determined by its impedance and the current flowing through current source 106) does not affect the operation of current source 106. In this case the total current provided by current sources 106 and 110 to summing node 108 is greater than the current that current sink 112 can absorb from summing node 108. To respect KCL, the total current provided by current sources 106 and 110 is decreased in order to equal the current sunk by current sink 112. That is accomplished by increasing the voltage at output 116 to a voltage close to reference voltage 104 so that current sources 106 and 110 no longer operate at a constant current rate; they will operate at a lower current, determined by the voltage difference between reference voltage 104 and the voltage at summing node 108. Likewise, if the fuse is blown, its impedance is appropriately high so that the voltage drop across its terminals (determined by its impedance and the current flowing through current source 106) is high enough so that the voltage drop across current source 106 (determined by reference voltage 104, the voltage drop on fuse 102 and the voltage at output 116) is low enough so that the current provided by 106 is negligible compared to the current provided by 110. In this case, the total current that current sources 106 and 110 can provide to summing node 108 is lower than the current absorbed by current sink 112 from summing node 108. As required by KCL, the current sunk by current sink 112 is decreased in order to match the total current provided to summing node 108. That is accomplished by decreasing the voltage at output 116 so that it is close to reference voltage 114. Thus, the voltage at output 116 is close to reference voltages 104 or 114 depending upon the fuse state.

Figure 2:
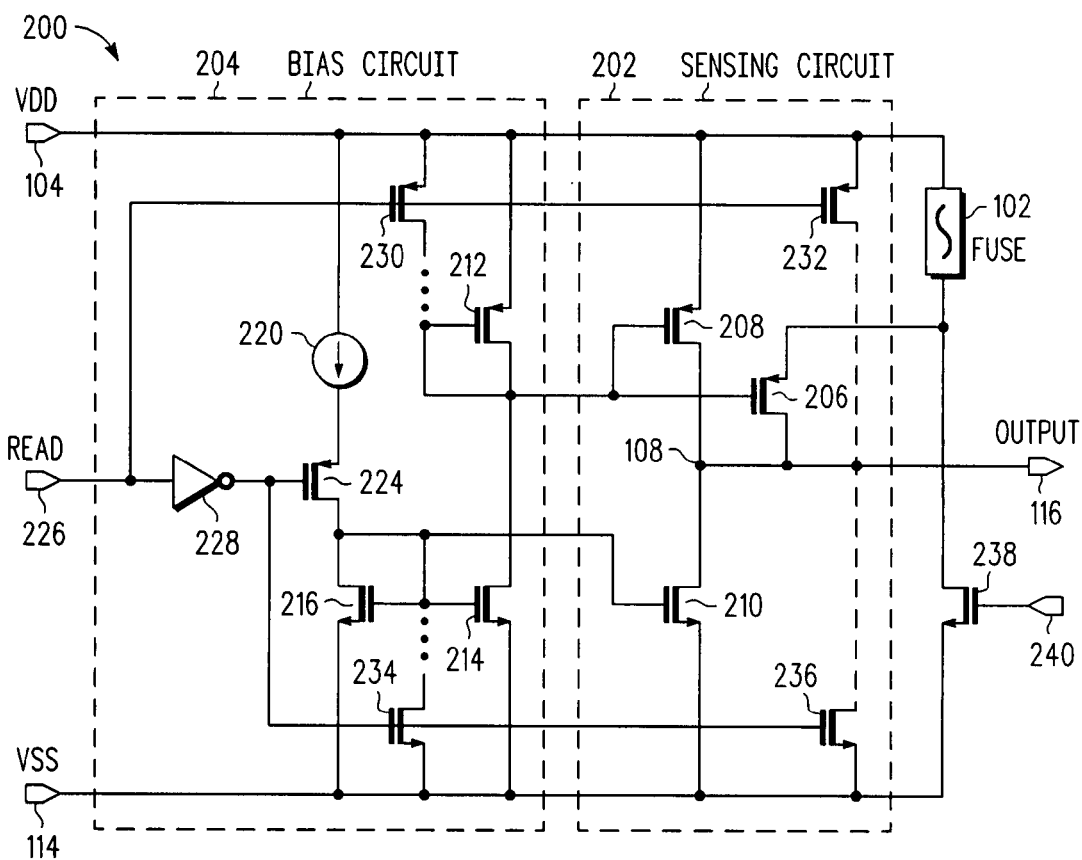
FIG. 2 is a high-level schematic diagram of a nonvolatile memory cell in accordance with one or more embodiments.

With reference to FIG. 2, there is depicted a high-level schematic diagram of portions of nonvolatile memory cell 200 in accordance with one or more embodiments. As illustrated, memory cell 200 includes sensing circuit 202 and bias circuit 204. Sensing circuit 202 is configured and adapted to read, and output, the state of the memory cell, where the state of the memory cell is represented by the state (e.g., blown, or non-blown) of programmable fuse 102. Bias circuit 204 is adapted and configured to provide appropriate electrical bias voltages to sensing circuit 202, which are needed to read and output the state of the memory cell.

In sensing circuit 202, fuse 102 has a first terminal coupled to a first reference voltage 104 (e.g., a reference "VDD" of a voltage supply), and a second terminal coupled to a first current electrode (e.g., a source electrode) of P-channel transistor 206 (e.g., first transistor 206 having a first conductivity type). A second current electrode (e.g., a drain electrode) of transistor 206 is coupled to summing node 108.

Sensing circuit 202 also includes P-channel transistor 208 (e.g., second transistor 208 having a first conductivity type), which has a source electrode coupled to first reference voltage 104, and a drain electrode coupled to summing node 108. A control electrode (e.g., a gate electrode) of transistor 208 is coupled to a gate electrode of transistor 206.

N-channel transistor 210 in sensing circuit 202 (e.g., third transistor 210 having a second conductivity type) has a drain electrode coupled to summing node 108, and a source electrode coupled to second reference voltage 114 (e.g., a reference "GND" of a voltage supply, VSS).

In one embodiment, fuse 102 can be a polysilicon fuse, which can be programmed by applying a programming current to the fuse. The programming current changes the conductivity of the fuse from a highly conductive state (i.e., a lower impedance state) to a poorly conductive state (i.e., a higher impedance state).

In bias circuit 204, P-channel transistor 212 (e.g., fourth transistor 212 having a first conductivity type) has a source electrode coupled to first reference voltage 104, a gate electrode coupled to the gate electrodes of transistors 206 and 208, and connected to its own drain electrode, the drain electrode of transistor 212. Thus, transistors 212 and 208 are in a current mirroring configuration, and transistors 212 and 206 are likewise in a current mirroring configuration. The current through transistor 212 can be referred to as a first bias current.

A current mirror is a circuit designed to copy (or produce a current that is proportional to) a current flowing through a first active device (e.g. a first transistor) by controlling the current in a second active device (e.g. a second transistor), and designed to attempt to keep the output current of the second active device constant regardless of loading. In bias circuit 204, transistors 212 and 208 are configured as a current mirror, wherein the current through transistor 212 (e.g., a first bias current in a first bias circuit) is copied and maintained (to the extent allowed by the limits of the power supply or reference voltage 104 and a voltage at summing node 108) in the current through transistor 208. Likewise, transistors 212 and 206 are configured as a current mirror, wherein the current through transistor 212 is copied and maintained in the current through transistor 206 to the extent permitted by the state (i.e. the impedance) of fuse 102, the limits of power supply or reference voltage 104, and the voltage at summing node 108. The bias current through transistor 212 can be thought of or viewed as limiting the current through both transistors 206 and 208, which both mirror the bias current through transistor 212.

Transistor 210 is also part of a current mirror circuit, wherein the gate electrode of transistor 210 is coupled to the gate electrode of transistor 216 (e.g., a fifth transistor 216 having a second conductivity type) in bias circuit 204. Transistor 216 is an N-channel transistor having a source electrode coupled to second reference voltage 114, and a drain electrode coupled to a drain electrode of P-channel transistor 224. The gate electrode of transistor 216 is also coupled to the gate electrode of transistor 214, which is an N-channel transistor having a source electrode coupled to reference voltage 114, and a drain electrode coupled to the drain electrode of transistor 212. Note that transistor 214 is in a mirror configuration with transistor 216. The current through transistor 216 can be referred to as a second bias current. The bias current through transistor 216 can be though of as limiting the current through transistor 210, which mirrors the bias current through transistor 216.

Note that transistor 208, which is part of a current mirroring circuit, acts as a current source, such as current source 110 in FIG. 1. Similarly, transistor 206, which is also part of a current mirroring circuit, acts as a current source, such as current source 106 in FIG. 1. Transistor 210, which is part of a current mirroring circuit, acts as a current sink, such as current sink 112 in FIG. 1.

Current source 220, which, in one embodiment, can source from 1 to 2 micro Amps (μA), has a first terminal coupled to voltage reference 104 and a second terminal coupled to a source electrode of P-channel transistor 224. In some embodiments, current source 220 can be a resistor to limit the current. In other embodiments, current source 220 can use active components to limit the current. Current source 220 limits the current through transistor 216, and serves as a current reference or current limit for all transistors in a current mirroring configuration within memory cell 200. For example, current source 220 limits the current through transistor 216, which current is mirrored in transistors 214 and 210. The current through transistor 214 limits the current through transistor 212, which current is mirrored in transistors 206 and 208.

When read terminal 226 receives a high voltage (e.g., a voltage near voltage reference 104), the output of inverter 228 outputs a low voltage, which places transistor 224 in a conductive mode (i.e., turns transistor 224 on). When transistor 224 is conductive or on, transistors 216 and 212 also begin to pass current, wherein such current is then mirrored in transistors 206, 208, and 210 to the extent permitted by the power supply of limitations. Thus, when an active-high read signal is applied to read terminal 226, current sources 106 and 110, and current sink 112 become active, wherein each attempts to source or sink a predetermined current, subject to the limitations of supply voltages and output impedances (including the impedance of fuse 102).

When read terminal 226 receives a low voltage (e.g., a voltage near voltage reference 114), the output of inverter 228 outputs a high voltage, which causes transistor 224 to enter a high impedance state, which turns off transistors 214 and 216 and 212. When transistors 212 and 216 in bias circuit 204 are off, transistors 206, 208, and 210 are also off, which reduces power consumption when memory cell 200 is not being read.

In the embodiment of sensing circuit 202 in FIG. 2, transistors 232 and 236 are optional transistors (which is indicated by dashed-line connections to output terminal 116), wherein one or the other can be used to force output terminal 116 to either a high or a low voltage when the signal at read terminal 226 is inactive (e.g., low). To force output terminal 116 to a high voltage, only P-channel transistor 232 is needed in sensing circuit 202. Transistor 232 can have a source terminal coupled to reference voltage 104 and a drain terminal coupled to output terminal 116. The gate terminal of transistor 232 can be coupled to read terminal 226, which receives an active-high read signal. Thus, when read terminal 226 receives a low voltage input (i.e., an inactive read signal), transistor 232 turns on and pulls output terminal 116 high.

Alternatively, output terminal 116 can be pulled low by N-channel transistor 236. Transistor 236 can have a source terminal coupled to reference voltage 114, a drain terminal coupled to output terminal 116, and a gate terminal coupled to the output of inverter 228. When read terminal 226 receives a low voltage input (i.e., an inactive read signal), and the output of inverter 228 is high, transistor 236 is turned on and pulls output terminal 116 low.

In some embodiments of bias circuit 204, transistors 230 and 234 can be provided and used to turn off bias currents while a signal at read terminal 226 is inactive (e.g., low). Such bias currents can be turned off to save power. P-channel transistor 230 can have a source terminal coupled to reference voltage 104, a drain terminal coupled to the gate terminals of transistors 206, 208, and 212, and a gate terminal coupled to read terminal 226. When read terminal 226 is low (e.g. receiving an inactive read signal) transistor 230 is turned on, which applies reference voltage 104 to the gates of, and turns off, transistors 206, 208, and 212.

N-channel transistor 234 can have a source terminal coupled to reference voltage 114, a drain terminal coupled to the gate terminals of transistors 210, 214, and 216, and a gate terminal coupled to the output of inverter 228. When read terminal 226 is low (e.g. receiving an inactive read signal) the output of inverter 228 is high, which turns transistor 234 on, which, in turn, turns off transistors 210, 214, and 216.

N-channel transistor 238 can be used to allow a programming current to flow through fuse 102 as controlled by a signal on programming terminal 240. Transistor 238 can have a drain terminal connected to the second terminal of fuse 102, a source terminal connected to voltage reference 114, and gate terminal connected to programming terminal 240. An active-high signal on programming terminal 240 can apply the programming current to fuse 102.

Figure 3:
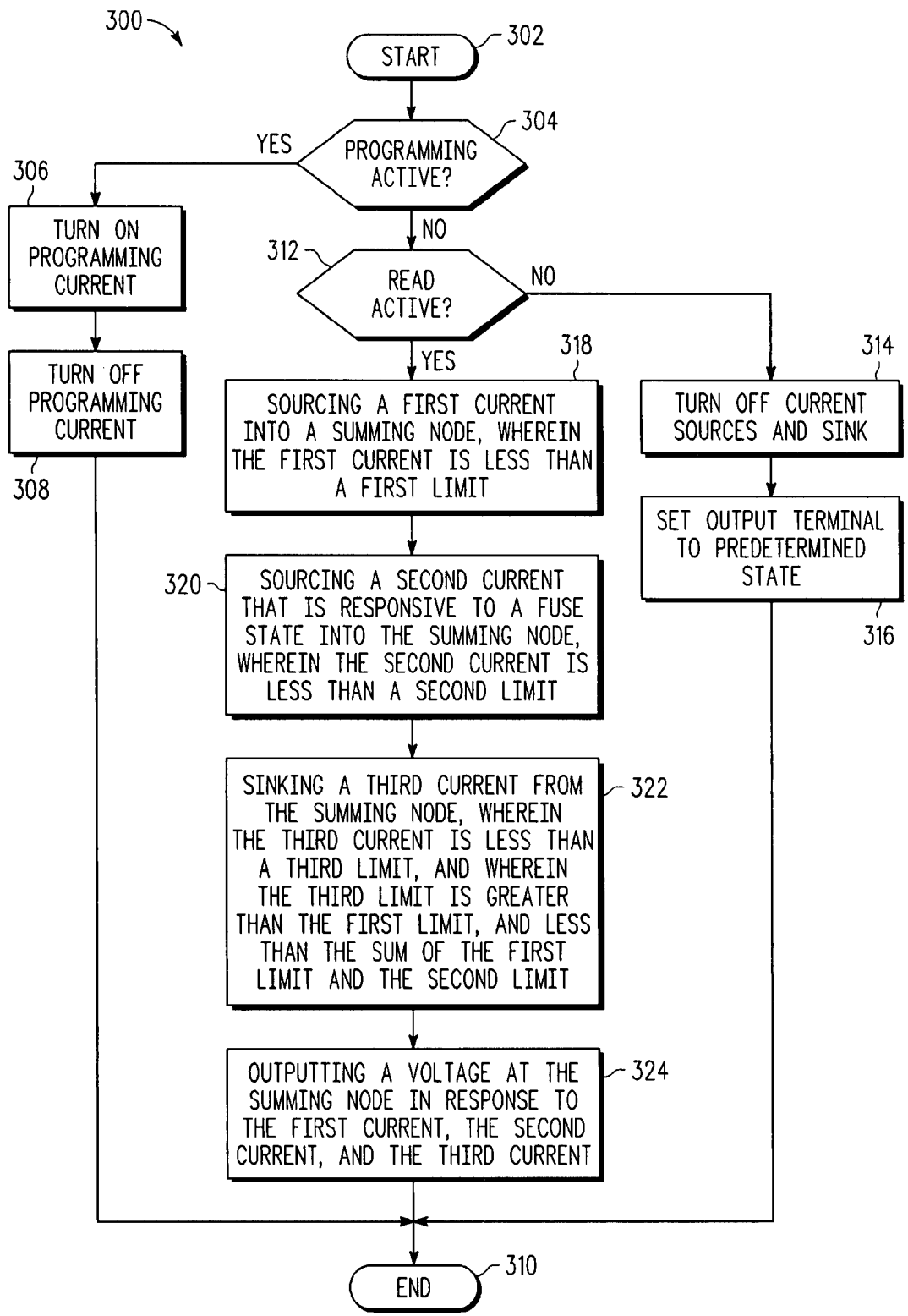
FIG. 3 is a high-level flowchart depicting a process that can be executed in a nonvolatile memory cell in accordance with one or more embodiments.

Illustrated in FIG. 3 is a high-level flowchart of processes that can be executed in a nonvolatile memory cell in accordance with one or more embodiments. As illustrated, the process begins at 302, and thereafter passes to 304 wherein the process determines whether the programming signal input is active. In one embodiment, the programming signal can be input into nonvolatile memory cell 200 at programming terminal 240, as shown in FIG. 2.

If the programming signal is active, the process turns on the programming current, as depicted at 306. As shown in FIG. 2, the programming current can be controlled by transistor 238. The programming current is a current sufficient to change the impedance of fuse 102 from a lower impedance to a higher impedance. In one embodiment, the programming current can be in the range of 1 milliamp (mA) to 10 mA, which is sufficient to melt a polysilicon fusible link and change the impedance of fuse 102 from a low impedance (e.g., near 10 ohms) to a high impedance (e.g., near 1 mega-ohm).

After a period of time sufficient to change the impedance of fuse 102, the programming current is turned off, as shown at 308. In one embodiment, the programming current can be on for a period from 1 millisecond (mS) to 10 mS.

After programming the fuse, the process ends, as shown at 310. Note that the process shown in flowchart 300 can be iteratively repeated as needed. For example, the nonvolatile memory cell can be programmed (with the restriction that a programmable fusible link can be blown only once, as described above), in a first pass through flowchart 300, then the nonvolatile memory cell can remain inactive for a period of time, followed by a read operation, which can be represented by subsequent passes through flowchart 300.

If the programming signal is not active at 304, the process determines whether a read signal input is active, as depicted at 312. In one embodiment, the read signal can be input into nonvolatile memory cell 200 at read terminal 226, as illustrated in FIG. 2.

If the read signal is not active (i.e., inactive) the process turns off current sources and current sinks, as illustrated at 314. The current sources and sinks can be turned off to save power. In one embodiment, current sources and current sinks can be turned off by turning off currents in bias circuit 204, such as turning off currents through transistors 212 and 216 in FIG. 2. The currents through transistors 212 and 216 are mirrored in sensing circuit 202 by transistors 206, 208, and 210, which transistors act as current sources (e.g., transistors 206 and 208) and a current sink (e.g., transistor 210).

Next, the process can set a voltage at an output terminal to a predetermined state, as depicted at 316. In one embodiment, a transistor can be used to pull output terminal 116 either high or low, depending upon the design of the nonvolatile memory cell. If a high output state is designed, transistor 232 in FIG. 2 can be used to pull output terminal 116 high when the read signal on terminal 226 is inactive. Alternatively, if a low output state is designed, transistor 236 can be used to pull out the terminal 116 low when the read signal is inactive.

After turning off current sources and sinks at 314, and after setting the output terminal to a predetermined state at 316, the process of reading the state of a memory cell ends as shown at 310.

Although the processes of sourcing and sinking currents are shown as sequential processes in blocks 318, 320, and 322 of flowchart 300, in many embodiments such process steps occur substantially simultaneously. For example, in the embodiment shown in FIG. 2, when a read signal is applied to read terminal 226, currents begin to flow through bias circuit 204, which currents are mirrored in sensing circuit 202 to implement corresponding current sources 106 and 110 and current sync 112 shown in FIG. 1.

If the read signal is active at 312, the process sources a first current into a summing node, as illustrated at 318. In one embodiment, current source 110 can be used to source a first current into summing node 108, wherein the first current is less than (i.e., limited to) a first value or a first limit, as shown in FIG. 1. In FIG. 2, transistor 208 can source a first current into summing node 108, wherein transistor 208 mirrors (e.g., is limited by) a current passing through transistor 212. Note that part of the process of sourcing (and sinking) currents in memory cell 200 includes turning on current sources and the current sink, which includes turning on bias currents in bias circuit 204. For example, in 318, the bias current through 212 is turned on, which turns on current source 110, which is the current that passes through transistor 208.

The process also sources a second current into the summing node, wherein the second current is responsive to a fuse state, and wherein the second current is less than (i.e., limited to) a second value or a second limit, as depicted at 320. In one embodiment, the second current can be sourced by current source 106, which is coupled to reference voltage 104 through fuse 102 as shown in FIG. 1. The second current is responsive to the state of fuse 102 because fuse 102 is part of the output impedance of current source 106. For example, if fuse 102 is intact, it can have a low impedance and current source 106 can output a predetermined current (e.g., is limited to the second limit), to the extent allowed by the limits of reference voltage 104 and voltage at output terminal 108. Thus, current source 106 can provide the predetermined current until the output of current source 106 is essentially equal to the voltage of reference voltage 104.

If fuse 102 is blown (e.g., is in a high impedance date), current source 106 can momentarily attempt to provide the current that it is designed to output, but voltage dropped across blown fuse 102 and the limits of voltage source 104 immediately restrict the amount of current that can be output by current source 106 (e.g., limits the current to less than a fourth limit). Thus, the magnitude of the current output by current source 106 when fuse 102 is intact is much greater than the magnitude of the current output when fuse 102 is blown.

While sourcing the first and second currents, the process sinks a third current from the summing node, wherein the magnitude of the third current is less than a third value or third limit (i.e., the magnitude of the current as the current source or sink is designed), and wherein the third limit is greater than the first limit, and less than the sum of the magnitudes of the first limit and the second limit, as illustrated at 322. In one embodiment, the third current can be sunk by current sink 112 in FIG. 1. Current sink 112 is a practical current sink that can absorb current at a predetermined rate (i.e., limited to the third limit), subject to the output impedance of current sink 112 and the limitations of voltage references 104 and 114. For example, current sink 112 is designed, adapted, and configured to sink or absorb current at a predetermined rate (e.g., a predetermined amperage), but due to the output limitations of the connected voltage references (e.g., voltage references 104 and 114) current sink 112 cannot maintain the absorption of the predetermined amperage for more than the amount of time it takes to move an initial charge stored in any stray capacitances in the circuit.

As shown in the embodiment of FIG. 2, the third current can be sunk by transistor 210, which is in a current mirror configuration with transistor 216.

Finally, the process outputs a voltage at the summing node in response to the first current, the second current, and the third current, as depicted at 324. In one embodiment, the voltage at summing node 108 rises to approach the voltage of voltage reference 104 when the current available to summing node 108 exceeds the current absorbed from summing node 108, which occurs when fuse 102 is intact, in a lower impedance state. If fuse 102 has been blown and is in a higher impedance state, the voltage at summing node 108 will fall to approach the voltage of voltage reference 114 when the current that can be absorbed from summing node 108 exceeds the current available to summing node 108.

In FIG. 2, the voltage at summing node 108, which is the voltage at the output terminal 116, depends on whether the current available to summing node 108 exceeds the current that can be absorbed from summing node 108. The current sourced into summing node 108 can come from transistors 206 and 208. The current sunk from summing node 108 can be absorbed by transistor 210. The current sourced by transistor 206 depends upon the state of fuse 102. Fuse 102 can be in a blown state, which limits the current sourced by transistor 206, or in a non-blown state, which does not significantly limit the current sourced by transistor 206.

After outputting the voltage at summing node 108 (and at output terminal 116), the process of reading a memory cell ends at 310. Note that the process of reading a memory cell can be repeated as needed, and the process can also include reading multiple memory cells, in parallel or in series, in order to read data words. Also note that in some embodiments the current sources and sink can be turned off to save power.

Turning off transistors 212 and 216 in bias circuit 204 can turn off corresponding mirrored currents in transistors 206, 208, and 210 in sensing circuit 202 (see FIG. 2).

Although the invention is described herein with reference to specific embodiments, various modifications and changes can be made without departing from the scope of the present invention as set forth in the claims below. For example, while the techniques and apparatus for reading a memory cell may vary widely, one or more embodiments can be used in nonvolatile memory integrated circuits, or portions of integrated circuits using nonvolatile memory for storing data, program code, operational parameters, calibration data, trimming circuits, or the like. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for reading a memory cell having a programmable fuse comprising:
    sourcing a first current from a first current source into a summing node, wherein the first current source is coupled to a first reference, and the first current is less than a first value;
    sourcing a second current from a second current source into the summing node, wherein the second current source is coupled to the first reference through the programmable fuse, and the second current is less than a second value;
    sinking a third current from the summing node with a current sink, wherein the current sink is coupled to a second reference, and the third current is less than a third value, and wherein the third value is greater than the first value and less than the sum of the first value and the second value; and
    outputting a voltage at the summing node in response to the first current, the second current, and the third current.

2. The method for reading a memory cell according to claim 1 wherein the sourcing the first current from the first current source comprises sourcing a first current from a first current source mirrored with a first bias current in a bias circuit.

3. The method for reading a memory cell according to claim 1 wherein the sinking the third current from the summing node with the current sink comprises sinking a third current from the summing node with a current sink mirrored with a second bias current in a bias circuit.

4. The method for reading a memory cell according to claim 1:
    wherein the sourcing the first current from the first current source comprises sourcing a first current from a first current source mirrored with a first bias current in a bias circuit;
    wherein the sourcing the second current from the second current source comprises sourcing a second current from a second current source mirrored with the first bias current; and wherein the sinking the third current from the summing node with the current sink comprises sinking a third current from the summing node with a current sink mirrored with a second bias current in a bias circuit.

5. The method for reading a memory cell according to claim 1 further comprising:
   enabling the first current, the second current, and the third current in response to a read signal being in an asserted state; and
   disabling the first current, the second current, and the third current in response to the read signal being in a non-asserted state.

6. The method for reading a memory cell according to claim 1 wherein the outputting a voltage at the summing node comprises:
   outputting a higher voltage at the summing node to indicate the programmable fuse is not blown; and
   outputting a lower voltage at the summing node to indicate the programmable fuse is blown.

7. The method for reading a memory cell according to claim 2 wherein the sourcing the second current from the second current source comprises sourcing a second current from a second current source mirrored with the first bias current.

8. The method for reading a memory cell according to claim 5:
   wherein the enabling the first current and the second current in response to the read signal being in the asserted state comprises enabling a first bias current in a first bias circuit and sourcing a first current from a first current source mirrored with the first bias current and sourcing a second current from a second current source mirrored with the first bias current; and
   wherein the enabling the third current in response to the read signal being in the asserted state comprises enabling a second bias current in a second bias circuit and sinking a third current with a current sink mirrored with the second bias current.

9. A circuit for reading a programmable fuse state in a memory cell comprising:
   a first current source coupled between a first reference and a current summing node, wherein the first current source is configured to provide a first current that is less than a first limit;
   a second current source coupled to the current summing node;
   a programmable fuse having a first terminal coupled to the first reference, and a second terminal coupled to the second current source, wherein the second current source is configured to provide a high second current that is less than a second limit when the programmable fuse is in a non-blown state, and wherein the second current source is configured to provide a low second current that is lower than the high second current and less than a fourth limit when the programmable fuse is in a blown state; and
   a third current source coupled between the current summing node and a second reference, wherein the third current source is configured to provide a third current that is less than a third limit, and wherein the third limit is less than the sum of the first limit and the second limit, and the third limit is greater than the sum of the first limit and the fourth limit.

10. The circuit for reading a programmable fuse state according to claim 9 wherein the first current source comprises a second transistor of a first conductivity type having a first current electrode coupled to the first reference, and a second current electrode coupled to the summing node.

11. The circuit for reading a programmable fuse state according to claim 9 wherein the second current source comprises a first transistor of a first conductivity type having a first current electrode coupled to the second terminal of the programmable fuse, and a second current electrode coupled to the summing node.

12. The circuit for reading a programmable fuse state according to claim 9 wherein the third current source comprises a third transistor of a second conductivity type having a first current electrode coupled to the second reference, and a second current electrode coupled to the summing node.

13. The circuit for reading a programmable fuse state according to claim 9 wherein the first current source, the second current source, and the third current source are configured as a first current mirror, a second current mirror, and a third current mirror, respectively.

14. The circuit for reading a programmable fuse state according to claim 13 wherein the first current mirror comprises a first transistor coupled to a fourth transistor in a current mirror configuration, and wherein the second current mirror comprises the first transistor coupled to the fourth transistor in a current mirror configuration, and wherein the third current mirror comprises a third transistor coupled to a fifth transistor in a current mirror configuration.

15. A circuit for reading a state of a memory cell having a programmable fuse comprising:
   a programmable fuse having a first terminal coupled to a first reference, and a second terminal;
   a first transistor, of a first conductivity type, having a first current electrode coupled to the second terminal of the programmable fuse, a second current electrode, and a control electrode;
   a second transistor, of a first conductivity type, having a first current electrode coupled to the first reference, a second current electrode, and a control electrode coupled to the control electrode of the first transistor;
   a summing node coupled to the second current electrode of the first transistor and the second current electrode of the second transistor; and
   a third transistor, of a second conductivity type, having a first current electrode coupled to a second reference, a second current electrode coupled to the summing node, and a control electrode, whereby a voltage at the summing node corresponds to the state of the memory cell.

16. The circuit for reading a state of a programmable fuse according to claim 15 comprising a fourth transistor, of a first conductivity type, coupled to the first and second transistors in a current mirror configuration for controlling current through the first and second transistors.

17. The circuit for reading a state of a programmable fuse according to claim 15 comprising a fifth transistor coupled to the third transistor in a current mirror configuration for controlling current through the third transistor.

18. The circuit for reading a state of a programmable fuse according to claim 15 further comprising a bias circuit for controlling a first current in the first transistor, a second current in the second transistor, and a third current in the third transistor, wherein the bias circuit provides voltages for limiting the first current to a first limit, limiting the second current to a second limit, and limiting the third current to a third limit, and wherein the third limit is greater than the first limit, and the third limit is less than the sum of the first limit and the second limit.

19. The circuit for reading a state of a programmable fuse according to claim 16 wherein the fourth transistor has a first current electrode coupled to the first reference, a second current electrode, and a control electrode coupled to the second current electrode of the fourth transistor, and the control electrodes of the first and second transistors.

20. The circuit for reading a state of a programmable fuse according to claim 17 wherein the fifth transistor has a first current electrode, a second current electrode coupled to the second reference, and a control electrode coupled to the first current electrode of the fifth transistor, and the control electrode of the third transistor.

* * * * *